(12) United States Patent (10) Patent No.: US 6,201,447 B1
Tsutsui (45) Date of Patent: Mar. 13, 2001

(54) PHASE SYNCHRONIZATION CIRCUIT WITH UNITS FOR SETTING SWEEP FREQUENCY AND CONTROL VOLTAGE

(75) Inventor: Hideo Tsutsui, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/220,754

(22) Filed: Dec. 28, 1998

(30) Foreign Application Priority Data

Apr. 17, 1998 (JP) .................................................. 10-107918

(51) Int. Cl.⁷ .................................................. H03B 23/00
(52) U.S. Cl. .................. 331/4; 331/17; 329/307; 375/327
(58) Field of Search .................. 331/4, 178, 17; 329/307; 375/327

(56) References Cited

U.S. PATENT DOCUMENTS 4,349,789 * 9/1982 Kurihara .................................... 331/4
4,940,951 * 7/1990 Sakamoto .................................... 331/4

* cited by examiner

*Primary Examiner*—Arnold Kinkead
(74) *Attorney, Agent, or Firm*—Rabin & Champagne, P.C.

(57) ABSTRACT

Improved phase synchronization circuits shorten the length of the synchronization pull-in time. The phase synchronization circuit according to the first invention changes the free-running frequency of the voltage control oscillation means starting from one limit frequency of the sweep range when detecting a state of non-synchronization and performing a synchronization pull-in operation. The phase synchronization circuit according to the second invention changes the free-running frequency of the voltage control oscillation means starting to one limit frequency of the sweep range faster than a prescribed speed and then changes the free-running frequency of the voltage control oscillation means to the other limit frequency of the sweep range at the prescribed speed when detecting a state of non-synchronization and performing a synchronization pull-in operation.

15 Claims, 9 Drawing Sheets

PHASE SYNCHRONIZATION CIRCUIT WITH UNITS FOR SETTING SWEEP FREQUENCY AND CONTROL VOLTAGE

BACKGROUND OF THE INVENTION

1. Field of the Invention

The present invention relates to a phase synchronization circuit which is applicable to, for example, a carrier wave reproduction time shortening circuit of a synchronization detector installed in a demodulator of a digital wireless apparatus.

2. Description of Related Art

A synchronization detector installed in, for example, a demodulator of a digital wireless apparatus, detects a signal by demodulating a modulated signal based on a carrier wave reproduced on the receiving side. A phase synchronization circuit used to reproduce the carrier wave of this synchronization detector controls the phase and frequency of an output signal comparing the phase of the input signal with that of the output signal.

Figure 1:
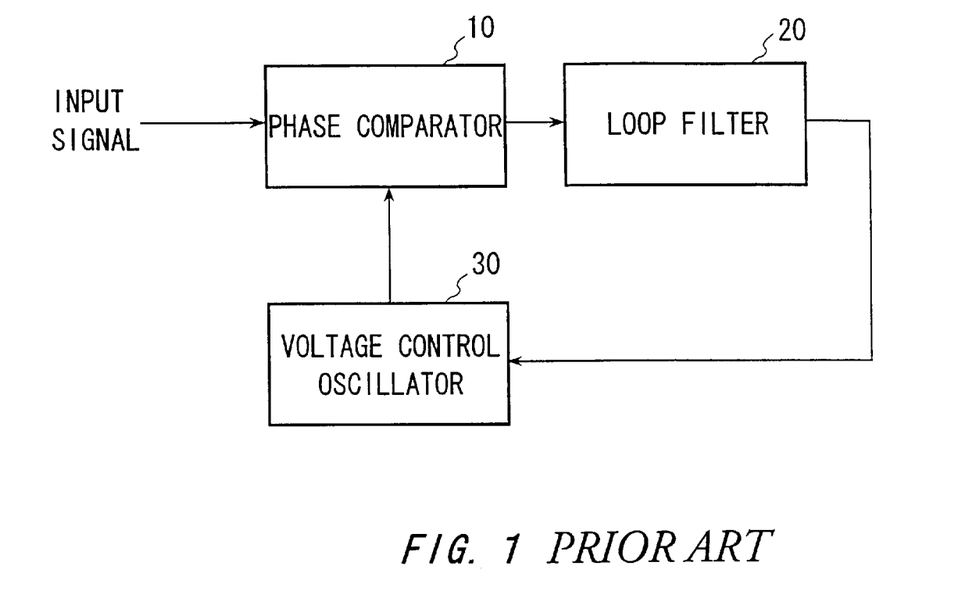
FIG. 1 is a block diagram showing the fundamental configuration blocks of a conventional phase synchronization circuit.

FIG. 1 is a block diagram showing the fundamental configuration blocks of this phase synchronization circuit. The fundamental operation of this circuit will be described below. First, the phase comparator (PC) 10 detects the phase difference between the phase of an input signal to be used as a reference and the phase of the output signal of the voltage control oscillator (VCO) 30 that is oscillating near a frequency to be output. The loop filter 20 then generates a control voltage based on the detected phase difference and supplies the control voltage to the VCO 30 to change the oscillation frequency of the VCO 30. In this case, the oscillation frequency of the output signal is stabilized by feeding back the changed oscillation frequency of the VCO 30 to the PC 10 so that phase difference between the input signal and output signal of the VCO 30 will be eliminated.

Figure 2:
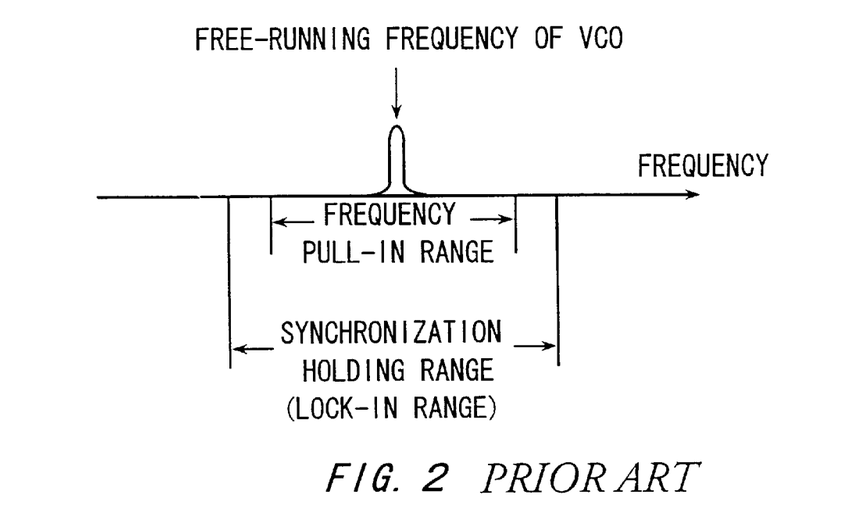
FIG. 2 shows the relation between the synchronization holding range (lock-in range), frequency pull-in range, and free-running frequency of the VCO.

FIG. 2 shows the relation between the synchronization holding range (lock-in range), frequency pull-in range, and free-running frequency of the VCO (oscillation frequency when the input to VCO is zero). Here, the synchronization holding range is a range of frequency in which the state of synchronization (the state in which the phase is locked in) can be held when the frequency of the input signal is gradually removed from the free-running frequency of the VCO. The frequency pull-in range is a range of frequency in which the output signal in the state of non-synchronization can be synchronized with the input signal when the frequency of the input signal is approached gradually to the free-running frequency of the VCO. In general, the SN ratio (signal-to-noise ratio) deteriorates as the synchronization holding range and frequency pull-in range become wider.

Figure 3:
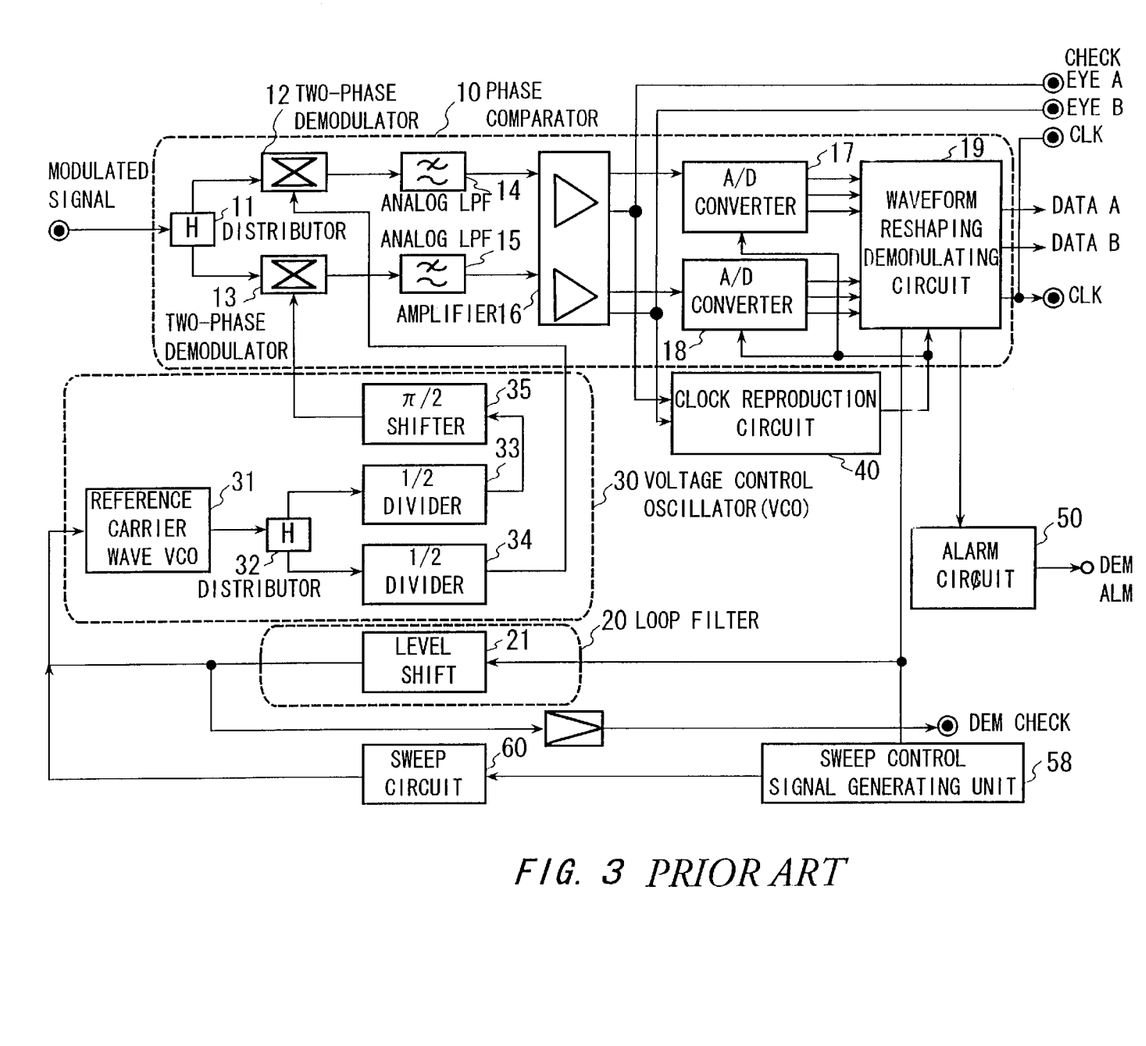
FIG. 3 is a block diagram showing the configuration blocks of a conventional phase synchronization circuit.

FIG. 3 is a block diagram showing the configuration blocks of the phase synchronization circuit having the above-described fundamental structure and operation. This phase synchronization circuit is used in a synchronization detector installed in a demodulator of a digital wireless apparatus. In FIG. 3, the same reference numerals are assigned to those components that are shown in FIG. 1.

In FIG. 3, the phase comparator 10 has a distributor 11, two-phase demodulators 12 and 13, analog LPFs (low pass filters) 14 and 15, an amplifier 16, A/D converters 17 and 18, and a waveform reshaping demodulating circuit 19. The loop filter 20 has a level shift 21. The voltage control oscillator 30 has a reference carrier wave VCO 31, a distributor 32, ½ dividers 33 and 34, and a π/2 shifter 35. In addition, this phase comparator 10 has a clock reproduction circuit 40, an alarm circuit 50, a sweep control signal generating unit 58, and a sweep circuit 60. The sweep control signal generating unit 58 may be installed inside the wave-form reshaping demodulating circuit 19.

In FIG. 3, the distributor 11 distributes a received modulated signal to the two-phase demodulators 12 and 13. The carrier signal reproduced by the VCO 30 is also supplied to the two-phase demodulators 12 and 13. Each of the two-phase demodulators 12 and 13 generates a phase difference signal in accordance with the phase difference between these two signals. These two-phase demodulators 12 and 13 have a multiplication function like, for example, a ring demodulator. Output signals of the two-phase demodulators 12 and 13 contain unwanted higher harmonics. The analog LPFs 14 and 15 remove these unwanted higher harmonics.

The amplifier 16 amplifies the phase difference signals supplied from the analog LPFs 14 and 15 that have eliminated the unwanted higher harmonics and then send the resultant phase difference signals to the A/D converters 17 and 18, respectively. The A/D converters 17 and 18 then convert the phase difference signals into digital signals, and send the converted digital signals to the waveform reshaping demodulating circuit 19.

The waveform reshaping demodulating circuit 19 reshapes the given phase difference signal while removing noise and distortion from the given phase difference signal to generate a reshaped phase difference signal and demodulates the original data signal based on the reshaped phase difference signal. In addition, the waveform reshaping demodulating circuit 19 generates a control signal based on the phase difference signals from the A/D converters 17 and 18 and supplies the control signal to the level shift 21. The level shift 21 then generates a control voltage and supplies the control voltage to the reference carrier wave VCO 31.

The reference carrier wave VCO 31 reproduces a reference carrier signal having a frequency that corresponds to the given control voltage, and sends the reference carrier signal to the two-phase demodulators 12 and 13 via the distributor 32, ½ dividers 33 and 34, and π/2 shifter 35.

The clock generating circuit 40 reproduces a clock signal based on the phase difference signal supplied from the amplifier 16. The alarm circuit 50 generates an alarm signal when the modulated signal cannot be received.

The phase synchronization circuit shown in FIG. 3 further has a sweep control signal generating unit 58 and a sweep circuit 60 in addition to the basic circuit structure of the phase synchronization circuit shown in FIG. 1. The control signal output from the waveform reshaping demodulating circuit 19 is supplied to the sweep control signal generating circuit 58. The sweep control signal generating circuit 58 determines whether the modulated signal is in synchronization with the output signal of the voltage control oscillator 30 based on this control signal. If these signals are not synchronized, the sweep control signal generating circuit 58 sends a sweep start control signal to the sweep circuit 60. The sweep control signal generating circuit 58 sends a sweep stop control signal to the sweep circuit 60 when the modulated signal becomes synchronized with the output signal of the voltage control oscillator 30.

Figure 4:
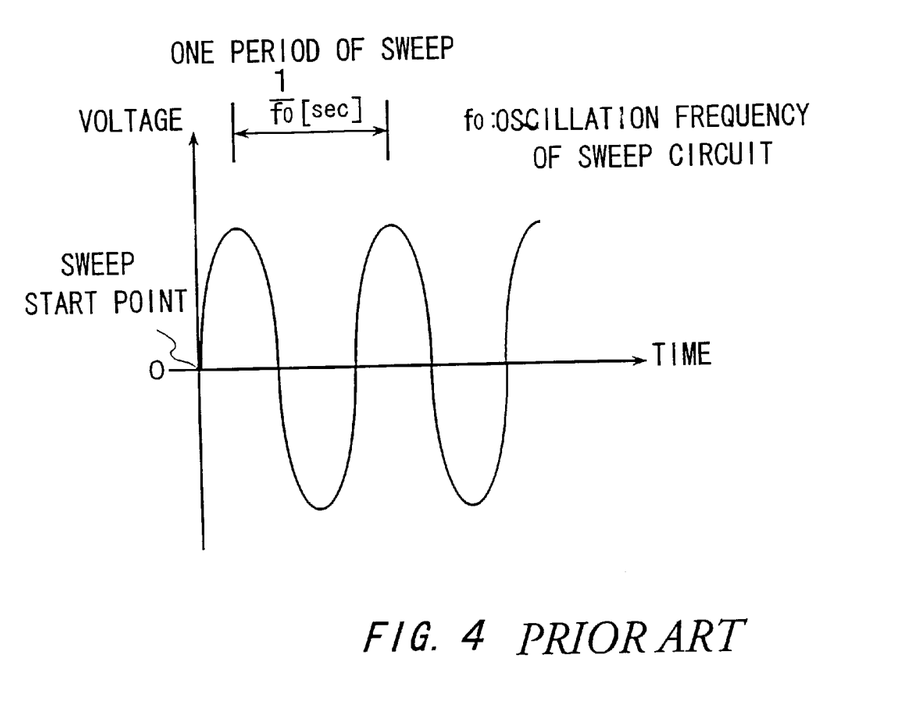
FIG. 4 shows an exemplary operation characteristic of the conventional sweep circuit.

FIG. 4 shows an exemplary operation characteristic of the sweep circuit 60. In this example, the sweep circuit 60 is a Wien-Bridge oscillator whose oscillation frequency is several Hz. The sweep circuit 60 oscillates or stops oscillating based on an impedance difference. When the sweep start control signal is supplied to the sweep circuit 60, the sweep circuit 60 outputs a sweep wave, which is a sine wave as shown in FIG. 4. This sweep wave is supplied to the reference carrier wave VCO 31. The reference carrier wave VCO 31 changes its free-running frequency based on the level of the sweep wave. As a result, the frequency pull-in range is expanded.

Figure 5:
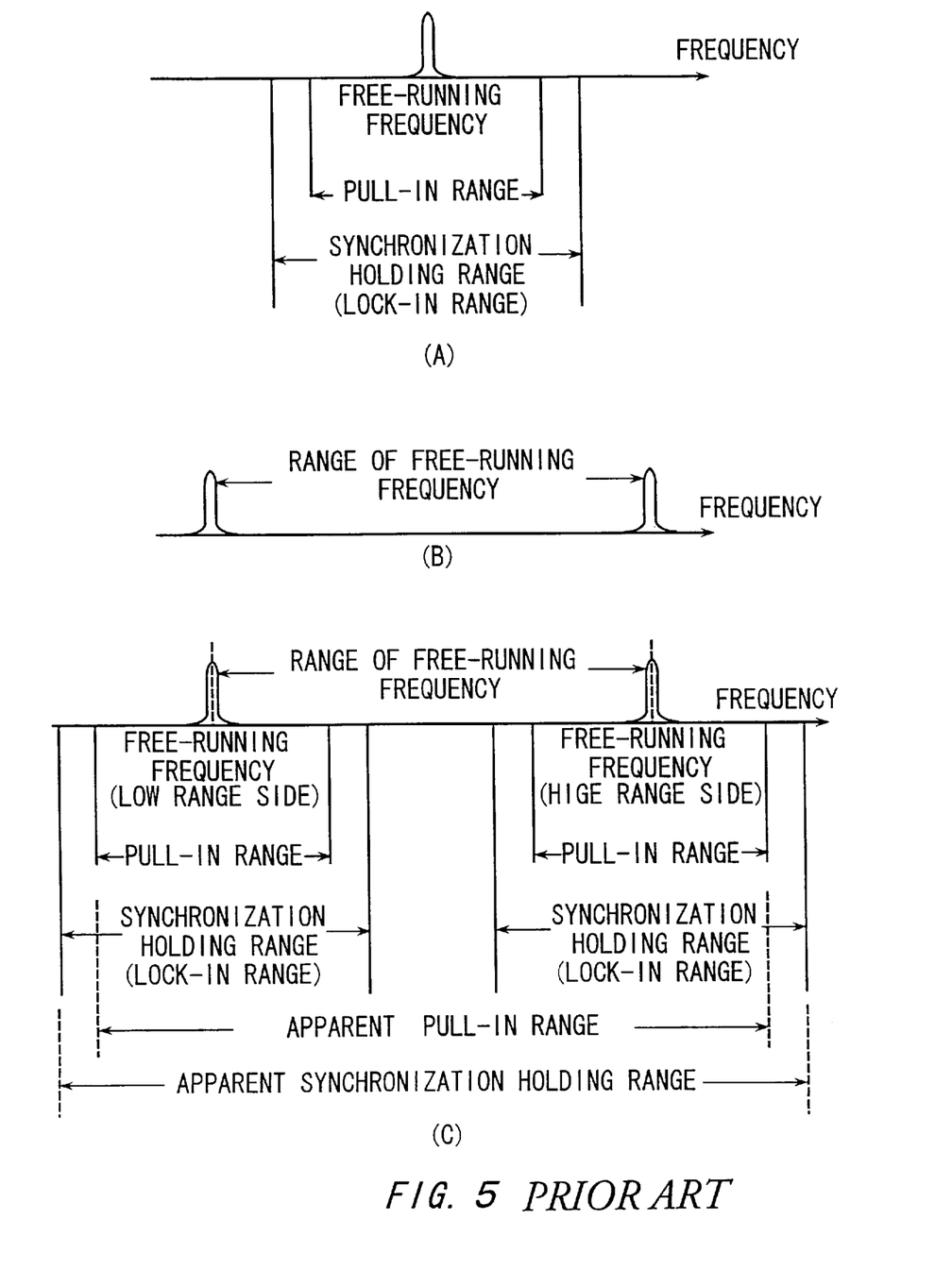

FIG. 5(a) shows the frequency characteristic of the phase synchronization circuit shown in FIG. 1 that does not have the sweep circuit 60. The centers of the frequency pull-in range and synchronization holding range of the phase synchronization circuit shown in FIG. 1 coincide approximately with the free-running frequency of the phase synchronization circuit.

FIG. 5(b) shows the range of the free-running frequency of the phase synchronization circuit having the sweep circuit 60 shown in FIG. 3. The oscillation of the sweep circuit 60 determines the range of the free-running frequency of the reference carrier wave VCO 31. In other words, the range of the free-running frequency of the reference carrier wave VCO 31 is expanded based on the amplitude of the sweep wave shown in FIG. 4 generated by the sweep circuit 60.

FIG. 5(c) shows the apparent frequency pull-in range and apparent synchronization holding range based on the free-running frequency of the reference carrier wave VCO 31 shown in FIG. 5(b). Comparing FIG. 5(c) with FIG. 5(a), it becomes evident that the apparent frequency pull-in range and apparent synchronization holding range shown in FIG. 5(c) are wider than the apparent frequency pull-in range and apparent synchronization holding range shown in FIG. 5(a), respectively.

In this case, the influence of the input noise is the same as in the case of the previously described basic circuit of the phase synchronization circuit. Hence, the quality of communication deteriorates when the SN ratio deteriorates. Therefore, in this case also, the quality of communication is maintained by confining the synchronization holding range and frequency pull-in range within a narrow band.

Figure 6:
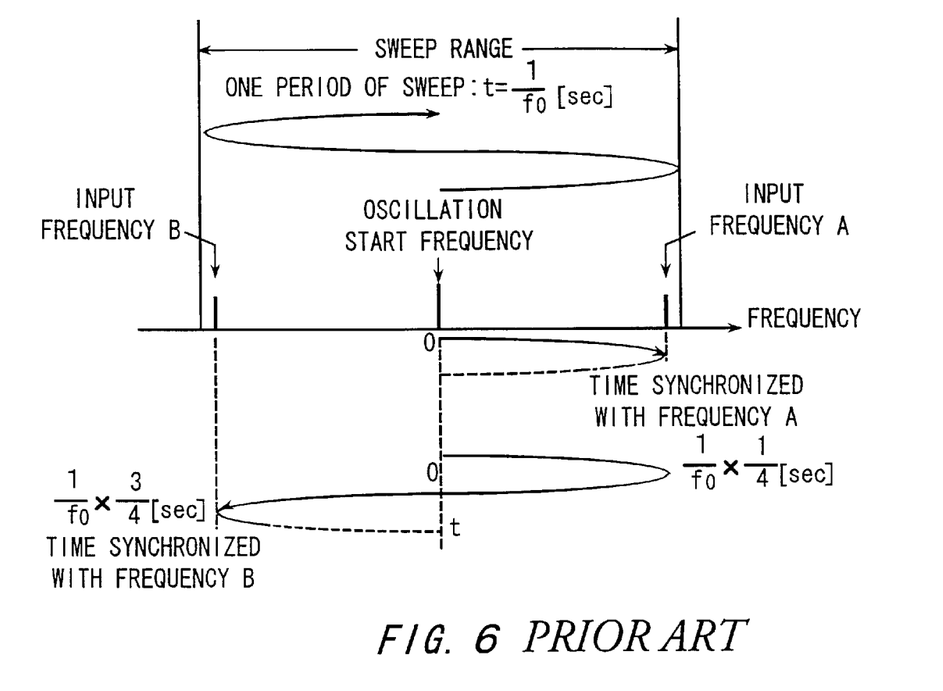
FIG. 6 is an image diagram showing the maximum synchronization pull-in time according to the prior art.

FIG. 6 shows lengths of time the phase synchronization circuit used in the conventional synchronization detector requires to be synchronized with the input frequencies. One period of the sweep is $1/f_0$, where $f_0$ is the oscillation frequency of the sweep circuit 60. The length of time require to be synchronized with the input frequency A is ¼ period of the sweep ($¼ \times 1/f_0$). The length of time required to be synchronized with the input frequency B is ¾ period of the sweep ($¾ \times 1/f_0$). Therefore, when this phase synchronization circuit transits from a synchronized state to a non-synchronized state as a result of change in the input frequency, the maximum length of time required to return to the synchronized state from the non-synchronized state (synchronization pull-in time) is equal to ¾ period of the sweep as described by the following equation.

$$¾ \times 1/f_0 [\text{sec}] \quad \text{Equation 1}$$

$f_0$: oscillation frequency of sweep circuit 60

During this non-synchronized state, communication between the apparatuses is terminated. Therefore, it is desirable that the synchronization pull-in time be as short as possible.

However, the synchronization response speed of the conventional phase synchronization circuit is slow since the synchronization holding range and frequency pull-in range are confined within a narrow band. Therefore, if the period of one sweep is shortened by increasing the oscillation frequency of the sweep circuit so as to shorten the length of the frequency pull-in time, the conventional phase synchronization circuit cannot respond to the sweep circuit, which is a problem.

For this reason, a phase synchronization circuit capable of shortening the length of the synchronization pull-in time is in demand.

SUMMARY OF THE INVENTION

It is an object of the present invention to provide a phase synchronization circuit capable of solving the above-stated problem. The object of the present invention can be achieved by a combination of characteristics described in the independent claims of the present invention. Moreover, the dependent claims of the present invention determine further advantageous embodiments of the present invention.

In order to solve the above-stated problem, according to the first embodiment of the present invention, a phase synchronization circuit for generating an oscillation signal in synchronization with a phase of an input signal is provided. This phase synchronization circuit has a phase difference detector for detecting a phase difference between the input signal and the oscillation signal, a loop filter for generating a control voltage that corresponds to the phase difference detected by the phase difference detector, a level setting circuit for setting the control voltage to a prescribed level, a sweep wave oscillation unit which superposes a sweep wave having a prescribed sweep frequency on the control voltage where the prescribed level set by the level setting circuit is used as a starting point, and a voltage control oscillation circuit for generating the oscillation signal having a frequency that corresponds to the control voltage on which the sweep wave is superposed.

According to one aspect of the present embodiment, the phase synchronization circuit may further have a sweep frequency setting unit for setting the frequency of the sweep wave to the prescribed sweep frequency.

According to another aspect of the present embodiment, the level setting circuit may further have a high frequency setting unit that sets the frequency of the sweep wave to a frequency that is higher than the prescribed sweep frequency.

According to a further aspect of the present embodiment, the sweep wave oscillation unit selectively superposes the sweep wave having the prescribed sweep frequency or the sweep wave having the frequency that is higher than the prescribed sweep frequency, onto the control voltage.

According to a still further aspect of the present embodiment, the phase synchronization circuit may further have a selecting unit that selectively connects the sweep frequency setting unit or the high frequency setting unit with the sweep wave oscillation unit.

According to still another aspect of the present embodiment, the selecting unit connects the high frequency setting unit with the sweep wave oscillation unit when superposing the sweep wave onto the control voltage and then connects the sweep frequency setting unit with the sweep wave oscillation unit after a prescribed length of time passes.

According to a further aspect of the present embodiment, the selecting unit connects the high frequency setting unit with the sweep wave oscillation unit when superposing the sweep wave onto the control voltage, and then connects the sweep frequency setting unit with the sweep wave oscillation unit when a level of the sweep wave exceeds a prescribed threshold value.

According to a still further aspect of the present embodiment, the selecting unit connects the high frequency setting unit with the sweep wave oscillation unit when superposing the sweep wave onto the control voltage, and then connects the sweep frequency setting unit with the sweep wave oscillation unit when the magnitude of the level of the sweep wave reaches a maximum level.

According to another aspect of the present embodiment, the phase synchronization may further have a pulse width adjusting unit for supplying a frequency change control signal to the selecting unit so as to switch a connection between the sweep wave oscillation unit and the high frequency setting unit to a connection between the sweep wave oscillation unit and the sweep frequency setting unit.

According to still another aspect of the present embodiment, the pulse width adjusting unit supplies the frequency change control signal to the selecting unit a prescribed length of time after the sweep wave starts to be oscillated.

According to a further aspect of the present embodiment, the prescribed length of time is set to approximately ¼ period of the sweep wave having the frequency that is higher than the prescribed sweep frequency when the high frequency sweep wave is oscillated starting from approximately the center of the sweep range.

According to a still further aspect of the present embodiment, the phase synchronization circuit may further have a sweep control signal generating unit for outputting a sweep start control signal which causes the sweep wave oscillation unit to start a sweep operation such that the sweep control signal generating unit outputs the sweep start control signal to the sweep wave oscillation unit when the oscillation signal is not in synchronism with the input signal.

According to another aspect of the present embodiment, the sweep control signal generating unit outputs to the sweep wave oscillation unit a sweep stop control signal for stopping the sweep operation when the oscillation signal is synchronized with the input signal.

According to further another aspect of the present embodiment, the level setting circuit sets the magnitude of the level of the control voltage to the prescribed level before the sweep wave having the sweep frequency reaches from a central voltage to the prescribed level.

In order to solve the above-stated problem, according to the second embodiment of the present invention, a phase synchronization method for synchronizing a phase of an oscillation signal with a phase of an input signal is provided. This phase synchronization method has steps of: detecting a phase difference between the input signal and the oscillation signal, generating a control voltage that corresponds to the phase difference, setting the control voltage to a prescribed level, superposing a sweep wave having a prescribed sweep frequency onto the control voltage using the prescribed level as a starting point, and generating the oscillation signal having a frequency that corresponds to said control voltage onto which said sweep wave is superposed.

According to one aspect of the present embodiment, the step of setting the control voltage to a prescribed level may have a step of oscillating the sweep wave having a frequency higher than the prescribed sweep frequency.

According to another aspect of the present embodiment, the step of superposing the sweep wave onto the control voltage may have a step in which the sweep wave having the frequency higher than the prescribed sweep frequency is superposed onto the control voltage and then after a prescribed length of time passes, the sweep wave having the prescribed sweep frequency is superposed onto the control voltage.

According to further another aspect of the present embodiment, the prescribed length of time is set equal to approximately ¼ period of the sweep wave having the frequency higher than the prescribed sweep frequency when the sweep wave having the frequency higher than the prescribed sweep frequency is oscillated starting from an approximate center of a sweep range.

According to still another aspect of the present embodiment, the step of superposing the sweep wave onto the control voltage has a step in which the sweep wave having the frequency higher than the prescribed sweep frequency is superposed onto the control voltage and then the sweep wave having the prescribed sweep frequency is superposed onto the control voltage when a level of the sweep wave exceeds a prescribed threshold value.

According to a further aspect of the present embodiment, the step of superposing the sweep wave onto the control voltage has a step in which the sweep wave having the frequency higher than the prescribed sweep frequency is superposed onto the control voltage and then the sweep wave having the prescribed sweep frequency is superposed onto the control voltage when a magnitude of the level of the sweep wave reaches approximately a maximum value.

According to another embodiment of the present invention, the following means are installed in a phase synchronization circuit having a phase difference detection means for detecting a phase difference between the input signal and the oscillation signal, a loop filter means for generating a control voltage that corresponds to the phase difference detected by the phase difference detection means, and a voltage control oscillation means for generating a oscillation signal having a frequency that corresponds to the control voltage.

In other words, (1) a synchronization determination means for determining whether the oscillation signal is synchronized with the input signal and (2) a sweep means which synchronizes the oscillation signal with the input signal by changing the free-running frequency of the voltage control oscillation means when this synchronization determination means determines that the oscillation signal is not synchronized with the input signal and performs a synchronization pull-in operation are provided. (3) This sweep means changes the free-running frequency of the voltage control oscillation means starting from one limit frequency of the sweep range.

According to this embodiment, when a state of non-synchronization is detected and a synchronization pull-in operation is performed, by changing the free-running frequency of the voltage control oscillation means starting from one limit frequency of the sweep range, the length of time required for the free-running frequency to change over the entire range can be shortened. As a result, the synchronization pull-in time can also be shortened.

According to another embodiment of the present invention, the following means are installed in a phase synchronization circuit having a phase difference detection means for detecting a phase difference between the input signal and the oscillation signal, a loop filter means for generating a control voltage that corresponds to the phase difference detected by the phase difference detection means, and a voltage control oscillation means for generating a oscillation signal having a frequency that corresponds to the control voltage.

In other words, (1) a synchronization determining means for determining whether the oscillation signal is synchronized with the input signal, and (2) a sweep means which synchronizes the oscillation signal with the input signal by changing the free-running frequency of the voltage control oscillation means when this synchronization determination means determines that the oscillation signal is not synchronized with the input signal and performs a synchronization pull-in operation are installed. (3) This sweep means changes the free-running frequency of the voltage control oscillation means to one limit frequency of the sweep range faster than a prescribed speed, and then changes the free-running frequency of the voltage control oscillation means to the other limit frequency at the prescribed speed.

According to this embodiment, when a state of non-synchronization is detected and a synchronization pull-in operation is performed, this sweep means changes the free-running frequency of the voltage control oscillation means to one limit frequency of the sweep range faster than a prescribed speed, and then changes the free-running frequency of the voltage control oscillation means to the other limit frequency at the prescribed speed. Hence, the length of time required for the free-running frequency to change over the entire range can be shortened. As a result, the synchronization pull-in time can also be shortened.

Moreover, the above-described summary of the present invention does not list all the essential characteristics of the present invention. Sub-combinations of these characteristics also are covered by the scope of the present invention.

BRIEF DESCRIPTION OF THE DRAWINGS

FIG. 5($a$) shows the frequency characteristic of the phase synchronization circuit shown in FIG. 1 that does not have the sweep circuit 60.

FIG. 5($b$) shows the range of the free-running frequency of the phase synchronization circuit having the sweep circuit 60 shown in FIG. 3.

FIG. 5($c$) shows the apparent frequency pull-in range and apparent synchronization holding range based on the free-running frequency of the reference carrier wave VCO 31 shown in FIG. 5($b$).

FIG. 8($a$) shows the apparent operation characteristic of the sweep circuit according to the first embodiment.

FIG. 8($b$) magnifies the sweep wave curve shown in FIG. 8($a$) from time 0 to time $t_2$.

FIG. 8($c$) shows a sweep frequency change control signal that corresponds to the operation characteristic shown in FIG. 8($b$).

DETAILED DESCRIPTION OF THE INVENTION

In what follows, the present invention will be explained with embodiments of the present invention. However, the following embodiments do not restrict the scope of the invention described in the claims. Moreover, not all the combinations of the characteristics of the present invention described in the embodiments are essential to the problem solving means by of the present invention.

(A) First Embodiment

In what follows, the first embodiment of the present invention will be explained with reference to FIGS. 3 and 7. In the first embodiment, a phase synchronization circuit of the present invention is applied to a synchronization detector installed in a demodulator of a digital wireless apparatus.

The phase synchronization circuit according to the first embodiment has the same configuration blocks as the conventional phase synchronization circuit shown in FIG. 3. However, the sweep circuit 60 of the phase synchronization circuit according to the first embodiment further has a function capable of changing the frequency in two stages. As shown in FIG. 7, the phase synchronization circuit according to the first embodiment further has a pulse width adjusting circuit 70 to which a sweep start/stop control signal is input. The pulse width adjusting circuit 70 generates a sweep frequency change control signal based on the sweep start control signal or sweep stop control signal and supplies the sweep frequency change control signal to the sweep circuit 60. Therefore, these additional features and additional components that are not installed in the conventional phase synchronization circuit will be explained in detail in the following.

Figure 7:
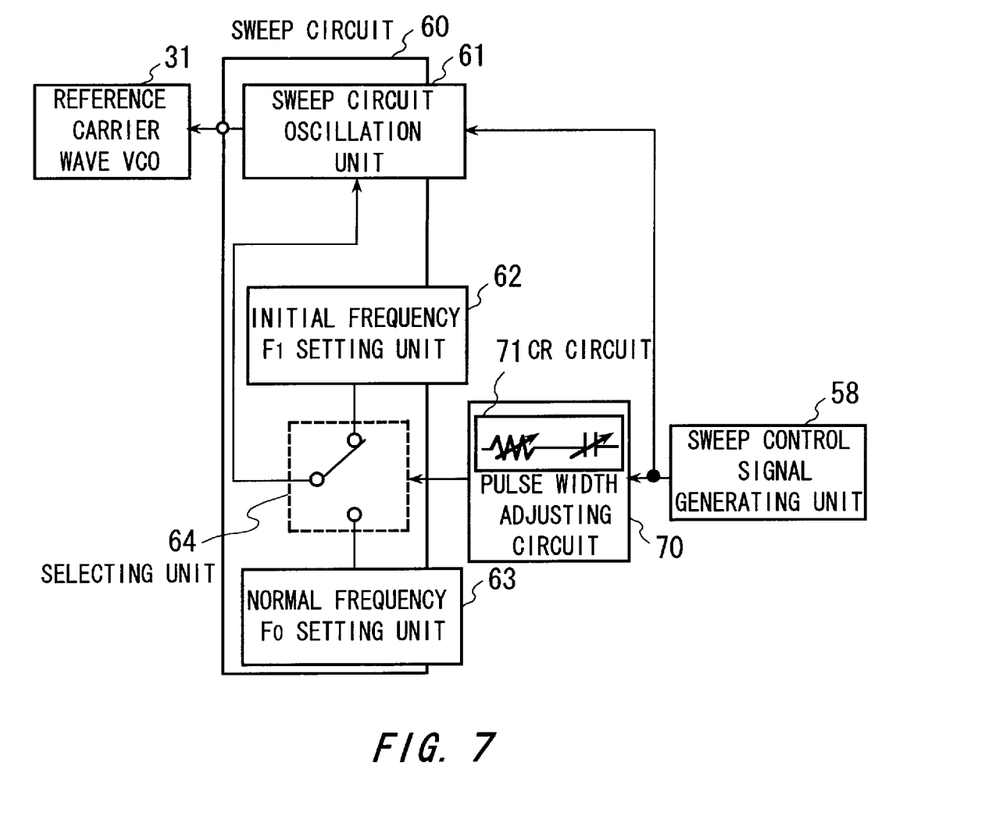
FIG. 7 is a block diagram showing in detail the configuration of the sweep circuit and pulse width adjusting circuit according to the first embodiment.

FIG. 7 is a block diagram showing in detail the configuration of the sweep circuit 60 and pulse width adjusting circuit 70 according to the first embodiment. This sweep circuit 60 has a sweep circuit oscillation unit 61, an initial frequency $f_1$ setting unit 62, a normal frequency $f_0$ setting unit 63, and a selecting unit 64. The sweep control signal generating unit 58 supplies a sweep start/stop control signal to the sweep circuit oscillation unit 61 and pulse width adjusting circuit 70. The pulse width adjusting circuit 70 in this embodiment has an adjusting CR circuit 71 for delaying the input signal. When the pulse width adjusting circuit 70 receives a sweep start signal, the pulse width adjusting circuit 70 generates a sweep frequency change control signal after a prescribed length of delay, and supplies the sweep frequency change control signal to the sweep circuit 60. This initial frequency $f_1$ setting unit 62 is an exemplary level setting circuit which instantaneously supplies a prescribed voltage to the reference carrier wave VCO 31. The voltage set by the level setting circuit is superposed on a control voltage supplied from the loop filter 20 and then is supplied to the reference carrier wave VCO 31. As an alternative, the level setting circuit may have another configuration capable of setting the control voltage to a prescribed level. As another alternative, the level setting circuit may have a configuration capable of supplying a voltage having a prescribed level directly to the reference carrier wave VCO 31 by charging a capacitor.

The sweep circuit oscillation unit 61 superposes a sweep wave, which has a frequency set by the normal frequency $f_0$ setting unit 63, on the control voltage starting from a prescribed level set by the level setting circuit. In this embodiment, the initial frequency $f_1$ setting unit 62 is the level setting circuit. When a sweep start signal is given to the sweep circuit oscillation unit 61, the sweep circuit oscillation unit 61 oscillates a high frequency sweep wave set by the initial frequency $f_1$ setting unit 62. After the voltage to be supplied to the reference carrier wave VCO 31 has been raised to a prescribed level, the sweep circuit oscillation unit 61 superposes the sweep wave having the sweep frequency onto the control voltage using the prescribed voltage level as the starting point.

Thus, by superposing the sweep wave onto the control voltage, the free-running frequency of the reference carrier wave VCO 31 changes, to change the frequency pull-in range. As a result, the phase synchronization circuit of the first embodiment is able to respond to the frequency of the input signal.

The normal frequency $f_0$ setting unit 63 supplies a normal frequency $f_0$ of the sweep wave to the selecting unit 64. The initial frequency $f_1$ setting unit 62 supplies a frequency $f_1$ that is higher than the normal frequency $f_0$ of the sweep wave to the selecting unit 64.

The selecting unit 64 selects either the normal frequency $f_0$ of the sweep wave supplied from the normal frequency $f_0$ setting unit 63 or the initial frequency $f_1$ supplied from the initial frequency $f_1$ setting unit 62, and supplies the selected frequency to the sweep circuit oscillation unit 61.

The pulse width adjusting circuit 70 generates a sweep frequency change control signal by delaying the pulse of the given sweep start signal by a prescribed length of time, and supplies the sweep frequency change control signal to the selecting unit 64. The adjusting CR (RC) circuit 71 of the pulse width adjusting circuit 70 performs this delay operation.

As mentioned before, the sweep control signal generating unit 58 generates a sweep start/stop control signal based on the control signal based on the phase difference signals supplied from the A/D converters 17 and 18 shown in FIG. 3. If the phase difference signals are in the synchronizable range, the sweep control signal generating unit 58 generates a sweep stop control signal. Otherwise, the sweep control signal generating unit 58 generates a sweep start control signal. The generated sweep start/stop control signal is then supplied to the pulse width adjusting circuit 70 and sweep circuit 60.

Next, the operations of the pulse width adjusting circuit 70 and sweep circuit 60 according to the first embodiment will be explained. The phase synchronization circuit according to the first embodiment contains a variable frequency type oscillator as shown in FIG. 7 in place of the conventional sweep circuit shown in FIG. 3.

Figure 8:
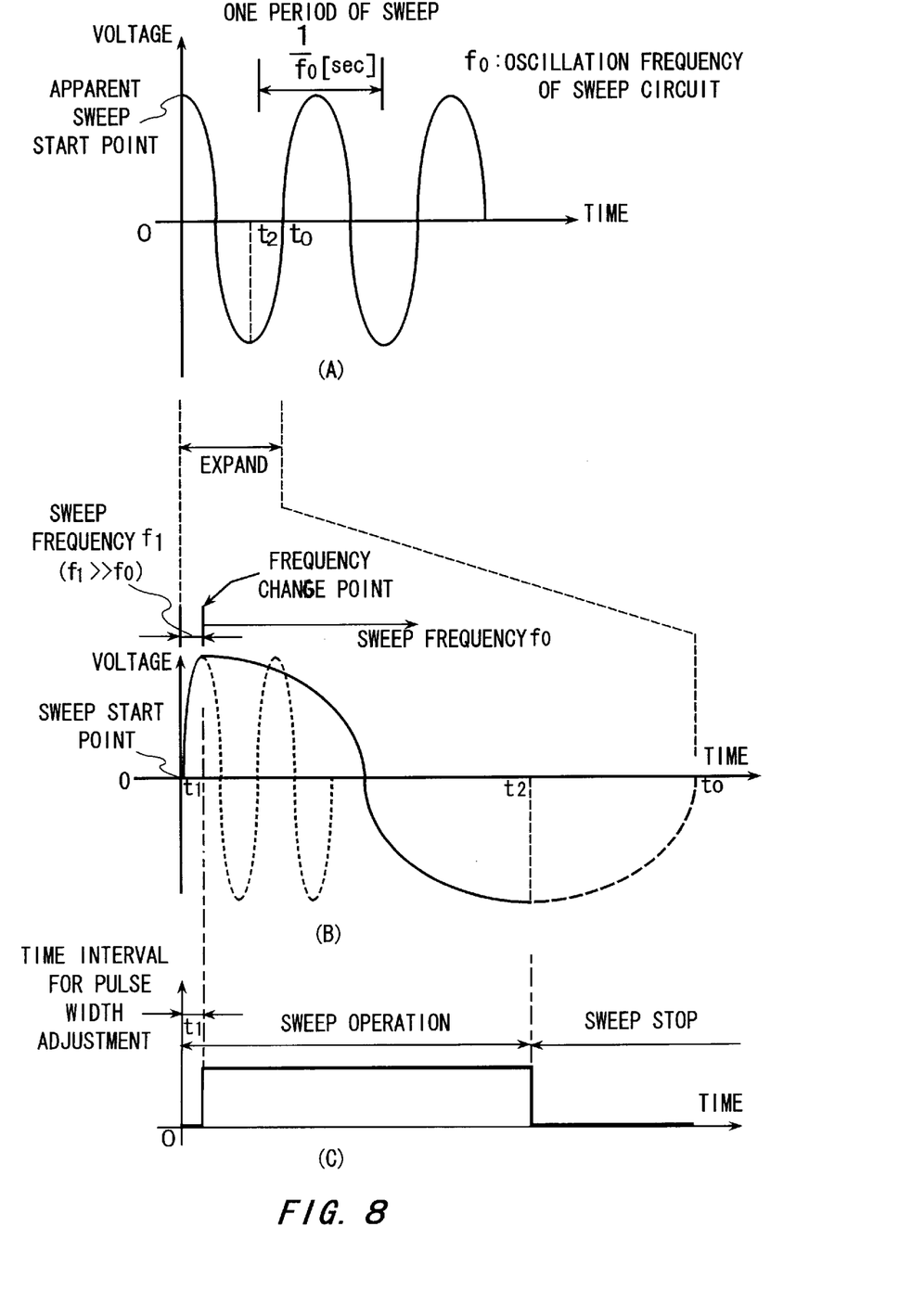

FIG. 8(*a*) shows the apparent operation characteristic of the sweep circuit 60 according to the first embodiment. Unlike the operation characteristic shown in FIG. 4, the apparent sweep is started from a prescribed voltage level as shown in FIG. 8(*a*).

FIG. 8(*b*) magnifies the sweep wave curve shown in FIG. 8(*a*) from time 0 to time $t_2$. In FIG. 8(*b*), the input signal is synchronized with the oscillation signal of the voltage control oscillator 30 at time $t_2$. The sweep wave indicated by the broken line has a sweep frequency $f_1$. The sweep wave indicated by the solid line has a sweep frequency $f_0$. Between time 0 and time $t_1$, the sweep wave having the sweep frequency $f_1$ is output from the sweep circuit oscillation unit 61. Time $t_1$ corresponds to $\frac{1}{4} \times 1/f_1$. Between time $t_1$ and time $t_2$, the sweep wave having the sweep frequency $f_0$ is output. The length of time $t_2-t_1$ corresponds to $\frac{1}{2} \times 1/f_0$. Since the sweep frequency $f_1$ is much higher than the sweep frequency $f_0$, the time interval between 0 and $t_1$ is much shorter than the time interval between $t_1$ and $t_2$. Therefore, the sweep appears to be started from the prescribed voltage level shown in FIG. 8(*a*).

FIG. 8(*c*) shows a sweep frequency change control signal that corresponds to the operation characteristic shown in FIG. 8(*b*). At $t_1$ seconds after the pulse width adjusting circuit 70 receives the sweep start control signal, the pulse width adjusting circuit 70 outputs a sweep frequency change control signal. When a state of synchronization is detected at time $t_2$, the pulse width adjusting circuit 70 outputs a sweep stop control signal. FIGS. 8(*b*) and 8(*c*) correspond to the case in which a state of synchronization is detected at time $t_2$. If the state of synchronization is detected at some time $t_{synch}$ before time $t_2$, the pulse width adjusting circuit 70 outputs a sweep stop control signal at $t_{synch}$. The sweep stop control signal is then input to the sweep circuit oscillation unit 61. The sweep circuit oscillation unit 61 then stops the oscillation of the sweep wave.

In FIG. 8(*a*), the sweep circuit 60 starts oscillating at the initial frequency $f_1$ ($f_1 \gg f_0$). When the pulse width adjusting circuit 70 generates a sweep frequency change control signal, the pulse width adjusting circuit 70 adjusts the pulse width of the sweep frequency change control signal using a variable capacitor and a variable resistor. At time $t_1$ that corresponds to $\frac{1}{4} \times 1/f_1$, that is when $\frac{1}{4}$ of the oscillation period has passed, the sweep frequency is changed to the normal frequency $f_0$ as shown in FIGS. 8(*b*) and 8(*c*). Since the initial frequency $f_1$ is much higher than normal frequency $f_0$, the sweep starting point coincides with the maximum or minimum of the sweep wave in the apparent operation characteristic of the sweep circuit 60 as shown in FIG. 8(*a*).

Figure 9:
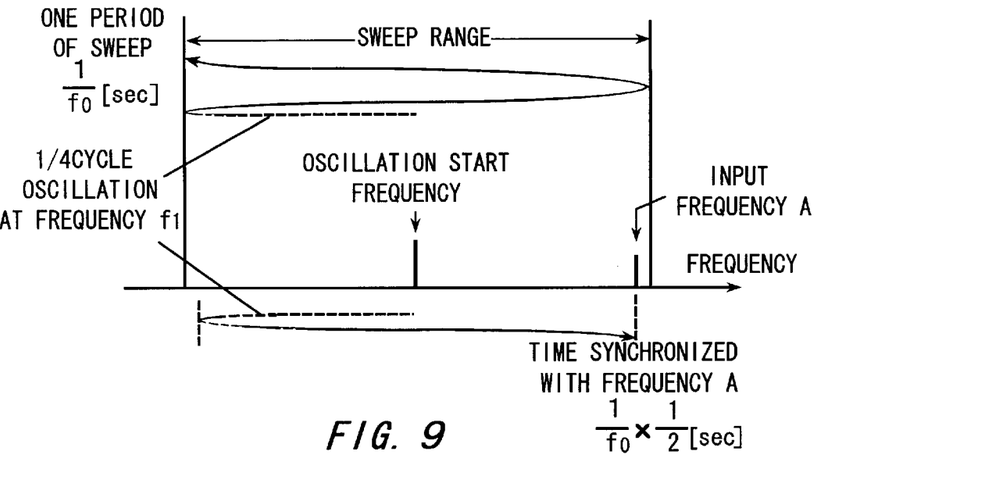
FIG. 9 is an image diagram showing the maximum synchronization pull-in time according to the first embodiment.

In this way, as shown in FIG. 9, the maximum synchronization pull-in time of the phase synchronization circuit of the first embodiment becomes ½ of one period $1/f_0$ of the sweep wave having the sweep frequency $f_0$ as described by the following equation.

$$\tfrac{1}{2} \times 1/f_0 [\text{sec}] \qquad\qquad \text{Equation 1}$$

$f_0$: oscillation frequency of sweep circuit

Thus, according to this first embodiment, when the sweep start signal is given, the sweep wave having the initial frequency $f_1$ is first output. The initial frequency $f_1$ of the sweep wave is changed to the normal frequency $f_0$ when the sweep wave becomes the maximum or minimum. As a result, the maximum synchronization pull-in time of the phase synchronization circuit of the first embodiment becomes ½ of one period $1/f_0$ of the sweep wave having the sweep frequency $f_0$, which is shorter than the maximum synchronization pull-in time achieved by the conventional phase synchronization circuit.

(B) Second Embodiment

In what follows, the second embodiment of the present invention will be explained with reference to FIGS. 10 and 11. In the second embodiment also, a phase synchronization circuit of the present invention is applied to a synchronization detector installed in a demodulator of a digital wireless apparatus.

The phase synchronization circuit according to the second embodiment has the same configuration blocks as the conventional phase synchronization circuit shown in FIG. 3. The sweep circuit 60 of the phase synchronization circuit according to the second embodiment also further has a function capable of changing the frequency in two stages. As shown in FIG. 10, the phase synchronization circuit according to the second embodiment further has a threshold value judging type pulse width adjusting circuit 80 to which a sweep start/stop control signal is input. The threshold value judging type pulse width adjusting circuit 80 generates a sweep frequency change control signal based on the sweep start/stop control signal and supplies the sweep frequency change control signal to the sweep circuit 60.

It is to be noted that, in this phase synchronization circuit according to the second embodiment, the threshold value judging type pulse width adjusting circuit 80 is installed in place of the pulse width adjusting circuit 70 constituted of a variable capacitor and a variable resistor of the first embodiment.

Figure 10:
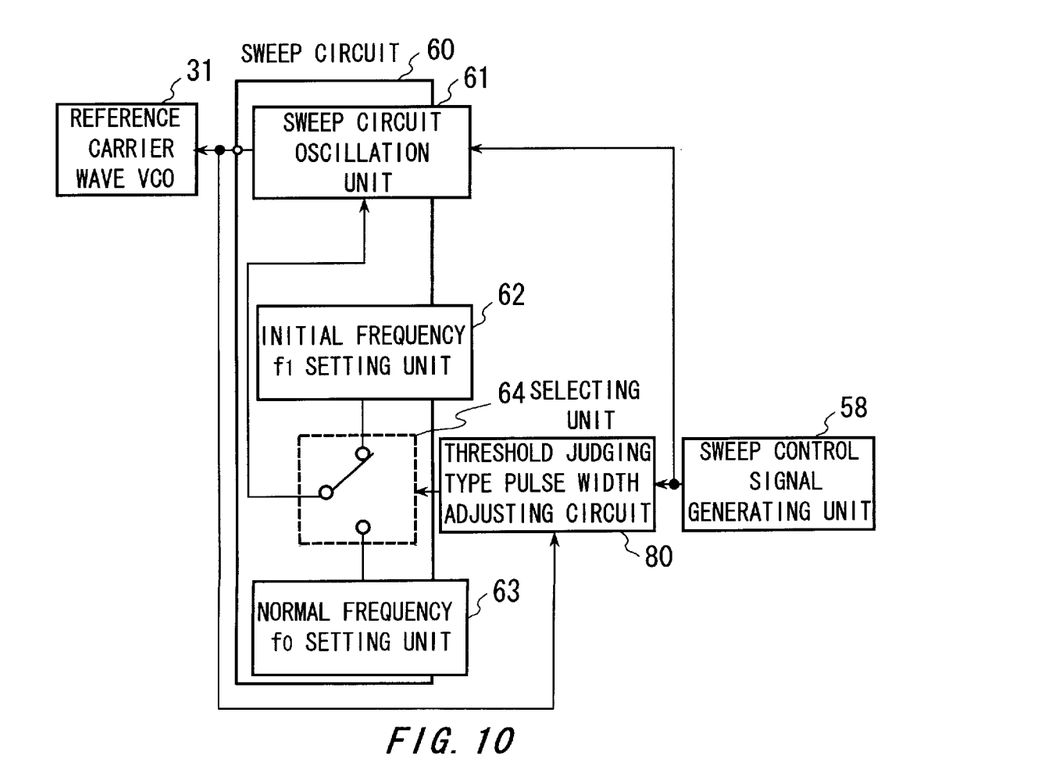
FIG. 10 is a block diagram showing in detail the structures of the sweep circuit and threshold value judging type pulse width adjusting circuit according to the second embodiment.

FIG. 10 is a block diagram showing in detail the structures of the sweep circuit 60 and threshold value judging type pulse width adjusting circuit 80 according to the second embodiment. This sweep circuit 60 has a sweep circuit oscillation unit 61, an initial frequency $f_1$ setting unit 62, a normal frequency $f_0$ setting unit 63, and a selecting unit 64. The sweep control signal generating unit 58 supplies a sweep start/stop control signal to the sweep circuit oscillation unit 61 and pulse width adjusting circuit 80. The initial frequency $f_1$ setting unit 62 is an exemplary level setting circuit which instantaneously supplies a voltage having a prescribed level to the reference carrier wave VCO 31. The sweep circuit oscillation unit 61 outputs a sweep wave having a sweep frequency $f_0$ or $f_1$ to the reference carrier wave VCO 31. This sweep wave is fed back to the threshold value judging type pulse width adjusting circuit 80. The threshold value judging type pulse width adjusting circuit 80 compares the voltage level of the sweep wave with a prescribed threshold level. If the voltage level of the sweep wave exceeds the prescribed threshold level, the threshold value judging type pulse width adjusting circuit 80 supplies a sweep frequency change control signal to the sweep circuit 60. In FIG. 10, the same reference numerals are assigned to those components used in FIG. 7 in the first embodiment.

When the sweep circuit oscillation unit 61 receives a sweep start signal, the sweep circuit oscillation unit 61 generates a sweep wave having a frequency selected by the selecting unit 64, superposes this sweep wave onto the control voltage supplied from the loop filter 20, and supplies the resultant sweep wave to the reference carrier wave VCO 31.

When the sweep wave is superposed on the control voltage in this way, the free-running frequency of the reference carrier wave VCO 31 changes causing the frequency pull-in range to change. As a result, this phase synchronization circuit according to the second embodiment is able to respond to the frequency of the input signal.

The normal frequency $f_0$ setting unit 63 supplies a normal frequency $f_0$ of the sweep wave to the selecting unit 64. The initial frequency $f_1$ setting unit 62 supplies a frequency $f_1$ that is higher than the normal frequency $f_0$ of the sweep wave to the selecting unit 64.

The selecting unit 64 selects either the normal frequency $f_0$ of the sweep wave supplied from the normal frequency $f_0$ setting unit 63 or the initial frequency $f_1$ supplied from the initial frequency $f_1$ setting unit 62, and supplies the selected frequency to the sweep circuit oscillation unit 61.

The threshold value judging type pulse width adjusting circuit 80 compares the voltage level of the sweep wave output from the sweep circuit oscillation unit 61 with a prescribed threshold level. It is desirable that the prescribed threshold level be determined near the maximum or minimum level of the sweep wave. When the voltage level of the sweep wave exceeds the prescribed threshold level, the threshold value judging type pulse width adjusting circuit 80 outputs a sweep frequency control signal to the sweep circuit 60.

As mentioned before, the sweep control signal generating unit 58 generates the sweep start/stop control signal based on the control signal based on the phase difference signals supplied from the A/D converters 17 and 18 shown in FIG. 3. If the phase difference signals are in the synchronizable range, the sweep control signal generating unit 58 generates a sweep stop control signal. Otherwise, the sweep control signal generating unit 58 generates a sweep start control signal. The generated sweep start/stop control signal is then supplied to the sweep circuit 60.

Next, the operations of the threshold value judging type pulse width adjusting circuit 80 and sweep circuit 60 according to the second embodiment will be explained. The phase synchronization circuit according to the second embodiment contains a variable frequency type oscillator as shown in FIG. 7 in place of the conventional sweep circuit shown in FIG. 3.

Figure 11:
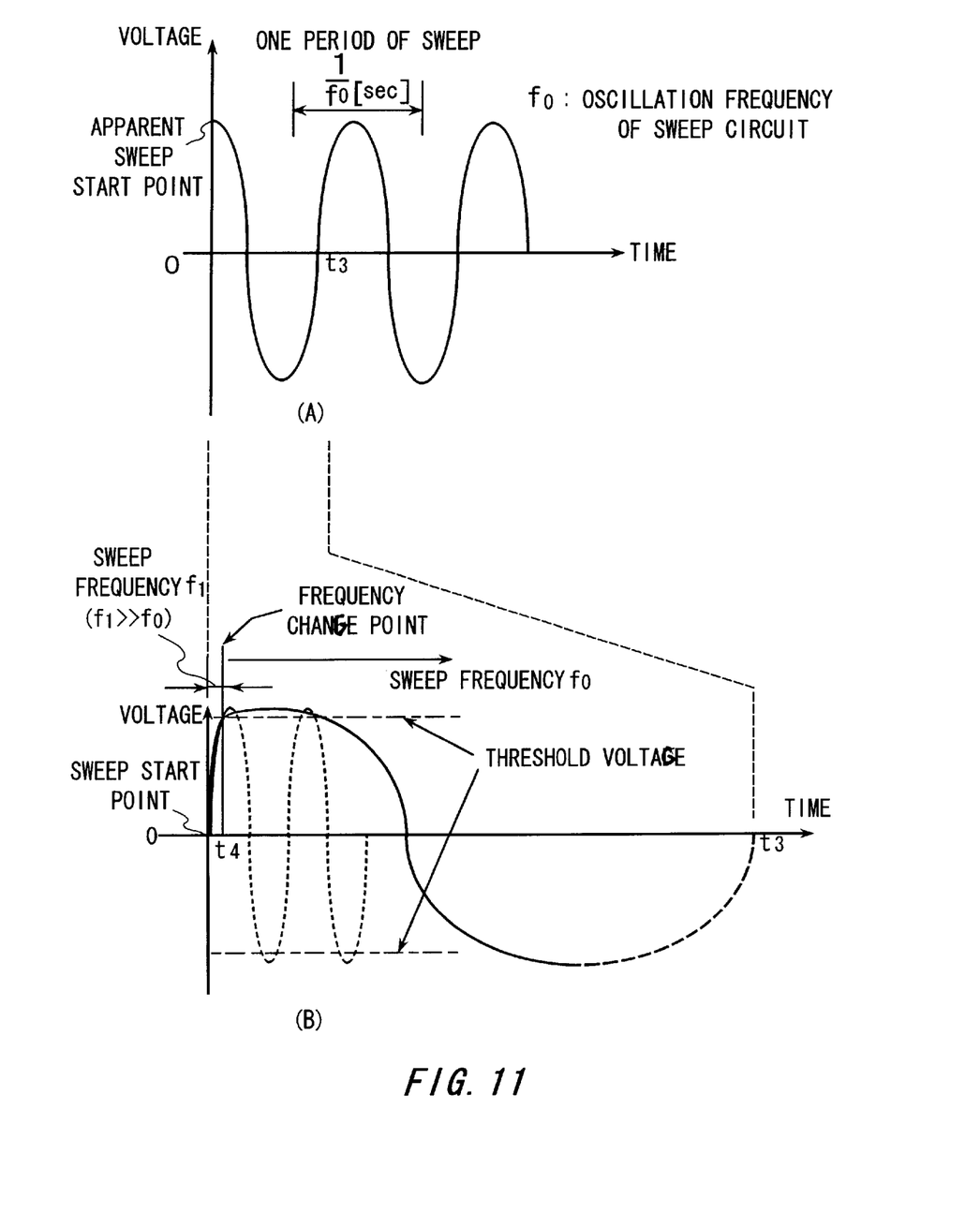
FIG. 11 shows an exemplary operation characteristic of the sweep circuit according to the second embodiment.

FIG. 11(*a*) shows the apparent operation characteristic of the sweep circuit 60 according to the second embodiment. Unlike the operation characteristic shown in FIG. 4, the apparent sweep is started from a prescribed voltage level as shown in FIG. 11(*a*).

FIG. 11(*b*) magnifies the sweep wave curve shown in FIG. 11(*a*) from time 0 to time $t_3$. The sweep wave indicated by the broken line has a sweep frequency $f_1$. This sweep wave continues to be output from the sweep circuit oscillation unit 61 until its voltage level exceeds the level of the prescribed threshold voltage. When the voltage level of this sweep wave exceeds the level of the prescribed threshold voltage at time $t_4$, the threshold value judging type pulse width adjusting circuit 80 outputs a sweep frequency change control signal to the selecting unit 64. The selecting unit 64 selects either the normal frequency $f_0$ of the sweep wave supplied from the normal frequency $f_0$ setting unit 63 or the initial frequency $f_1$ supplied from the initial frequency $f_1$ setting unit 62 based on the sweep frequency change control signal. The sweep circuit oscillation unit 61 then outputs a sweep wave having the normal frequency $f_0$. Since the level of the threshold voltage is set much lower than the maximum voltage level of the sweep wave, the length of time between time 0 and time $t_4$ corresponds approximately to $\frac{1}{4} \times 1/f_1$.

In FIG. 11, the sweep circuit 60 starts oscillating at the initial frequency $f_1$ ($f_1 >> f_0$). The sweep circuit 60 changes the sweep frequency to the normal frequency $f_0$ when the voltage level of the sweep wave exceeds the level of the prescribed threshold voltage as shown in FIG. 11(*b*). Since the initial frequency $f_1$ is much higher than the normal frequency $f_0$, the sweep starting point coincides with the maximum or minimum of the sweep wave in the apparent operation characteristic of the sweep circuit 60 as shown in FIG. 11(*a*).

Thus, according to this second embodiment as also in the first embodiment, when the sweep start signal is given, the sweep wave having the initial frequency $f_1$ that is much higher than the normal frequency $f_0$ is first output. The initial frequency $f_1$ of the sweep wave is changed to the normal frequency $f_0$ when the sweep wave becomes the maximum or minimum. As a result, the maximum synchronization pull-in time of the phase synchronization circuit of the second embodiment becomes approximately ½ of one period of the sweep wave, which is shorter than the maximum synchronization pull-in time achieved by the conventional phase synchronization circuit.

Moreover, according to this second embodiment, there is no need to spend time for adjusting the pulse width using the variable capacitor and variable resistor. As a result, the phase synchronization circuit according to this second embodiment can respond to any initial frequency more efficiently.

(C) Third Embodiment

In each of the above-described embodiments, the present invention is applied to a synchronization detector installed in a demodulator of a digital wireless apparatus. Needless to say, however, the present invention can also be applied to other devices or apparatuses besides synchronization detectors.

The phase synchronization apparatus described in each of the above-described embodiments first outputs a high frequency sweep wave when a sweep start signal is given. The phase synchronization apparatus then switches the initial frequency to the normal frequency when the amplitude of the sweep wave becomes the maximum or minimum and outputs the sweep wave. However, a circuit which changes the sweep wave to one limit point of the sweep range without changing the frequency and without specifying a particular waveform and then changes the sweep wave to the other limit point of the sweep range at a prescribed speed (to which the phase synchronization circuit of the present invention can respond) can also be applied to the present invention.

The phase synchronization circuit according to each of the embodiments changes the sweep wave immediately to the maximum or minimum by prescribing to the sweep wave an initial frequency that is far higher than the normal frequency. However, a circuit which changes the sweep wave to the limit point of the sweep wave at a suitable speed prescribing an initial frequency that is suitably higher than the normal frequency to the sweep wave may also be applied to the present invention if the initial frequency is determined within an admissible range of the specification of the circuit.

The phase synchronization circuit according to each of the embodiments starts the operation point of the sweep wave from the center of the sweep range and immediately brings the sweep wave to its maximum or minimum. However, a phase synchronization circuit which starts the operation of the sweep wave from one limit point of the sweep range can also be applied to the present invention.

In the first embodiment, a CR (RC) circuit is used as the delay circuit of the pulse width adjusting circuit. Needless to say, however, a circuit other than the CR circuit may be used as the delay circuit of the pulse width adjusting circuit.

Thus, according to the first invention, a synchronization determining means for determining whether the oscillation signal is synchronized with the input signal and a sweep means which synchronizes the oscillation signal with the input signal by changing the free-running frequency of the voltage control oscillation means when this synchronization determination means determines that the oscillation signal is not synchronized with the input signal and performs a synchronization pull-in operation are provided. This sweep means changes the free-running frequency of the voltage control oscillation means starting from one limit frequency of the sweep range. Therefore, the length of time required for the free-running frequency to change over the entire range can be shortened. As a result, the synchronization pull-in time can also be shortened.

According to the second invention, a synchronization determination means for determining whether the oscillation signal is synchronized with the input signal and a sweep means which synchronizes the oscillation signal with the input signal by changing the free-running frequency of the voltage control oscillation means when this synchronization determination means determines that the oscillation signal is not synchronized with the input signal and performs a synchronization pull-in operation are provided. This sweep means changes the free-running frequency of the voltage control oscillation means starting to one limit frequency of the sweep range faster than a prescribed speed, and then changes the free-running frequency of the voltage control oscillation means to the other limit frequency of the sweep range at the prescribed speed. Therefore, the length of time required for the free-running frequency to change over the entire range can be shortened. As a result, the synchronization pull-in time can also be shortened.

As is clear from the explanation provided above, according to the present invention, improved phase synchronization circuits are provided. So far, the present invention has been explained using preferred embodiments. However, the range of technical applications of the present invention is not limited to these embodiments. Other variations and modifications of the above-described embodiments should be evident to those skilled in the art. Accordingly, it is intended that such alterations and modifications be included within the scope and spirit of the present invention as defined by the following claims.

What is claimed is:

1. A phase synchronization circuit for generating an oscillation signal in synchronism with an input signal, comprising:

a phase difference detector for detecting a phase difference between the input signal and the oscillation signal;

a loop filter for generating a control voltage corresponding to the detected phase difference;

a sweep frequency setting unit for setting a frequency of a sweep wave to a prescribed sweep frequency;

a level setting circuit including
      a high frequency setting unit that sets the frequency of the sweep wave to a frequency that is higher than the prescribed sweep frequency, and
      a circuit initially setting the control voltage to a prescribed level;

a sweep wave oscillation unit that selectively superposes the sweep wave having the prescribed sweep frequency or the sweep wave having the higher frequency onto the control voltage, the prescribed level being set as a starting point of the sweep wave;

a voltage control oscillation circuit for generating the oscillation signal to have a frequency that corresponds to the control voltage; and a selecting unit, which selectively connects said sweep frequency setting unit or said high frequency setting unit with said sweep wave oscillation unit.

2. A phase synchronization circuit as claimed in claim 1, wherein said selecting unit connects said high frequency setting unit with said sweep wave oscillation unit when superposing said sweep wave onto said control voltage, and connects said sweep frequency setting unit with said sweep oscillation unit after a prescribed length of time.

3. A phase synchronization circuit as claimed in claim 1, wherein said selecting unit connects said high frequency setting unit with said sweep wave oscillation unit when superposing the sweep wave onto the control voltage, and then connects said sweep frequency setting unit with said sweep wave oscillation unit when a level of the sweep wave exceeds a prescribed threshold value.

4. A phase synchronization circuit as claimed in claim 1, wherein said selecting unit connects said high frequency setting unit with said sweep wave oscillation unit when superposing the sweep wave onto the control voltage, and connects said sweep frequency setting unit with said sweep wave oscillation unit when a magnitude of a level of said sweep wave substantially reaches a maximum level.

5. A phase synchronization circuit as claimed in claim 2, further comprising a pulse width adjusting unit which supplies a frequency change control signal for switching a connection between said sweep wave oscillation unit and said high frequency setting unit to a connection between said sweep wave oscillation unit and said sweep frequency setting unit, to said selecting unit.

6. A phase synchronization circuit as claimed in claim 5, wherein said pulse width adjusting unit supplies the frequency change control signal to said selecting unit a prescribed length of time after oscillation of the sweep wave has begun.

7. A phase synchronization circuit as claimed in claim 6, wherein the prescribed length of time is set to substantially one fourth of the period of the sweep wave having the higher frequency when the sweep wave having the higher frequency is oscillation starting from substantially a center of a sweep range.

8. A phase synchronization circuit for generating an oscillation signal in synchronization with an input signal, comprising:
   a phase difference detector for detecting a phase difference between the input signal and the oscillation signal;
   a loop filter for generating a control voltage that corresponds to the phase difference detected by said phase difference detector;
   a level setting circuit for initially setting the control voltage to a prescribed level in a shorter period than a period in which a sweep wave having a sweep frequency reaches from a central voltage to the prescribed level;
   a sweep wave oscillation unit that superposes the sweep wave having the prescribed sweep frequency onto the control voltage, the prescribed level being set as a starting point of the sweep wave; and
   a voltage control oscillation circuit for generating the oscillation signal to have a frequency that corresponds to the control voltage onto which the sweep wave is superposed.

9. A phase synchronization method for synchronizing a phase of an oscillation signal with a phase of an input signal, comprising the steps of:
   detecting a phase difference between the input signal and the oscillation signal;
   generating a control voltage that corresponds to the phase difference;
   oscillating a sweep wave at a frequency that is higher than a prescribed sweep frequency;
   setting the control voltage to a prescribed level;
   superposing the sweep wave having the higher frequency onto the control voltage;
   superposing the sweep wave having the prescribed sweep frequency onto the control voltage using the prescribed level as a starting point of the sweep wave at a timing corresponding to a predetermined condition of the higher frequency sweep wave; and
   generating the oscillation signal to have a frequency that corresponds to the control voltage.

10. A phase synchronization method as claimed in claim 9, wherein the sweep wave having the prescribed sweep frequency is superposed a prescribed length of time after said step of superposing the sweep wave having the higher frequency.

11. A phase synchronization method as claimed in claim 10, wherein the prescribed length of time is set equal to substantially one fourth of the period of the sweep wave having the higher frequency when the sweep wave having the higher frequency is oscillated starting from a substantial center of a sweep range.

12. A phase synchronization method as claimed in claim 9, wherein the sweep wave having the prescribed sweep frequency is superposed when a level of the sweep wave having the higher frequency exceeds a prescribed threshold value.

13. A phase synchronization method as claimed in claim 9, wherein the sweep wave having the prescribed sweep frequency is superposed when a magnitude of a level of the sweep wave having the higher frequency reaches substantially a maximum value.

14. A phase synchronization method for synchronizing a phase of an oscillation signal with a phase of an input signal, comprising the steps of:
   detecting a phase difference between the input signal and the oscillation signal;
   generating a control voltage that corresponds to the phase difference;
   oscillating a sweep wave having a high frequency that is higher than a prescribed sweep frequency;
   setting the control voltage to a prescribed level in a shorter period than a period in which the sweep wave having the sweep frequency reaches from a central voltage to the prescribed level;
   superposing the sweep wave having the prescribed sweep frequency onto the control voltage using the prescribed level as a starting point of the sweep wave; and
   generating the oscillation signal to have a frequency that corresponds to the control voltage.

15. A phase synchronization method as claimed in claim 9, wherein the sweep wave having the prescribed sweep frequency is superposed after said step of superposing the sweep wave having the higher frequency.

* * * * *